(12) United States Patent
Morgan

(10) Patent No.: US 10,277,189 B2
(45) Date of Patent: Apr. 30, 2019

(54) TRANSMISSION LINE REFLECTIONLESS FILTERS

(71) Applicant: Associated Universities, Inc., Washington, DC (US)

(72) Inventor: Matthew Alexander Morgan, Earlysville, VA (US)

(73) Assignee: Associated Universities, Inc., Washington, DC (US)

( * ) Notice: Subject to any disclaimer, the term of this patent is extended or adjusted under 35 U.S.C. 154(b) by 0 days.

(21) Appl. No.: 15/920,674

(22) Filed: Mar. 14, 2018

(65) Prior Publication Data

US 2018/0205355 A1 Jul. 19, 2018

Related U.S. Application Data

(63) Continuation of application No. 14/927,881, filed on Oct. 30, 2015, now Pat. No. 9,923,540.

(60) Provisional application No. 62/075,499, filed on Nov. 5, 2014.

(51) Int. Cl.
*H03H 7/00* (2006.01)
*H03H 7/01* (2006.01)
*H03H 7/06* (2006.01)

(52) U.S. Cl.
CPC ............ *H03H 7/00* (2013.01); *H03H 7/0123* (2013.01); *H03H 7/06* (2013.01)

(58) Field of Classification Search
CPC ........... H03H 7/00; H03H 7/0123; H03H 7/06
USPC ........................................................ 333/202
See application file for complete search history.

(56) References Cited

U.S. PATENT DOCUMENTS

| | | | |
|---|---|---|---|
| 3,514,722 A | 5/1970 | Cappucci et al. | |
| 3,605,044 A | 9/1971 | Seidel et al. | |
| 3,748,601 A | 7/1973 | Seidel | |
| 3,869,585 A | 3/1975 | Snyder | |
| 5,155,724 A * | 10/1992 | Edwards | .................. H03H 7/46 333/131 |
| 7,232,955 B1 | 6/2007 | Shadel et al. | |
| 2007/0152750 A1 | 7/2007 | Andersen et al. | |
| 2008/0297284 A1 | 12/2008 | Ishii et al. | |
| 2010/0205233 A1 | 8/2010 | Morgan | |
| 2012/0023059 A1 | 1/2012 | Morgan et al. | |

(Continued)

OTHER PUBLICATIONS

PCT Written Opinion and Search Report for PCT/US15/58229, dated Jul. 29, 2016.

(Continued)

*Primary Examiner* — Stephen E. Jones
*Assistant Examiner* — Samuel S Outten
(74) *Attorney, Agent, or Firm* — Remenick PLLC

(57) ABSTRACT

Reflectionless transmission line filters, as well as a method for designing such filters is disclosed. These filters preferably function by absorbing the stop-band portion of the spectrum rather than reflecting it back to the source, which has significant advantages in many different applications. The insertion of additional transmission line sections that change the phase response of the circuit without altering the amplitude response preferably allows follow-up transmission line identities to be applied in order to arrive at a more easily manufacturable filter topology. This facilitates their application over a higher frequency range the solely lumped-element circuits.

15 Claims, 6 Drawing Sheets

(56) References Cited

U.S. PATENT DOCUMENTS

2013/0257561 A1   10/2013  Gorostegui

OTHER PUBLICATIONS

Morgan, M. et al. Reflectionless Filter Structures. Jul. 29, 2014.
Morgan, M. Enhancement of Reflectionless Filters Using Stop-Band Sub-Networks. Jul. 2014.

* cited by examiner

TRANSMISSION LINE REFLECTIONLESS FILTERS

REFERENCE TO RELATED APPLICATIONS

This application is a continuation of U.S. Non-Provisional application Ser. No. 14/927,881, filed Oct. 30, 2015, which claims priority to U.S. Provisional Application No. 62/075,499, filed Nov. 5, 2014, both of which are entitled "Transmission Line Reflectionless Filters," and are hereby specifically and entirely incorporated by reference.

RIGHTS IN THE INVENTION

This invention was made with government support under Cooperative Agreement AST-0223851, between the National Science Foundation and Associated Universities, Inc., and, accordingly, the United States government has certain rights in this invention.

BACKGROUND

1. Field

The invention is directed toward electronic filters and methods of their use. Specifically, the invention is directed toward reflectionless electronic filters and methods of their use.

2. Background

Virtually all electronic systems use some kind of filtering to reject unwanted frequency components. In most conventional filters, the rejected signals are bounced back to the source, eventually dissipating in the generator itself, or in the interconnecting wires/transmission lines, or being radiated into the instrument housing. This manner of rejecting unwanted signals can sometimes lead to harmful interactions with other components in the system, either by spurious mixing in non-linear devices, unintentional re-biasing of sensitive active components, or cross-talk between various signal paths. A solution was sought for a filter that would absorb these unwanted signals before they could compromise performance. This led to a novel absorptive filter topology which was patented in 2013 (U.S. Pat. No. 8,392,495) as well as pending U.S. patent application Ser. No. 14/724,976 the entirety of both of which are incorporated by reference herein. These absorptive filters solved many problems encountered with conventional filters, such as the sensitivity of mixers to poor out-of-band terminations, detrimental and difficult-to-predict non-linear effects from reactive harmonic loading, leakage or cross-talk due to trapped energy between the filter and other poorly-matched components, and numerous other problems associated with out-of-band impedance matching. They also realized superior performance and manufacturability when compared to other approaches to absorptive filters, such as terminated diplexers and directional filter structures employing quadrature hybrids.

None of these prior embodiments, however, adequately taught how to implement such designs using transmission lines rather than lumped elements. The inability to easily convert these into transmission line form constrained the frequencies at which they could be effectively implemented to the cm-wave range and below. Recent efforts to address this issue have yielded a practical transmission line solution which extends the frequency range easily into submillimeter-waves while maintaining the benefits of the original reflectionless filter topology.

SUMMARY

The present invention addresses several of the problems and disadvantages associated with conventional filters, and with the prior art of reflectionless filters, thereby providing a new resource for band selection and definition in electronic systems.

An embodiment of the invention is directed to a reflectionless electronic filter. The filter comprises a symmetric two-port circuit, wherein the symmetry defines an even-mode equivalent circuit and an odd-mode equivalent circuit when the ports are driven in-phase and 180° out-of-phase, respectively; at least one transmission line and at least one lossy element or matched internal sub-network arranged within the symmetric two-port circuit such that: a normalized input impedance of the even-mode equivalent circuit is substantially equal to a normalized input admittance of the odd-mode equivalent circuit and a normalized input impedance of the odd-mode equivalent circuit is substantially equal to a normalized input admittance of the even-mode equivalent circuit. In this way, the even- and odd-mode equivalent circuits are said to be duals of each other.

To design a reflectionless filter using transmission lines, one may start with a lumped element prototype. Richard's Transformations are then applied to convert the circuit as derived into a transmission line form, called a network. Finally, transmission line identities are used to modify the transmission line network so that it is easier to manufacture in a desired medium (such as microstrip, coplanar waveguide, stripline, coaxial cable, waveguide, etc.) Application of these identities are often facilitated by the introduction of matched transmission line sections in cascade with the intermediate filter structures while the filter topology is being developed. This allows certain identity transforms to be used that would not be possible with the intrinsic filter structures.

In some embodiments, the resulting network comprises resonators formed by transmission-line stubs separated by cascaded transmission lines. In other embodiments, the resonators may be formed by alternating high- and low-impedance transmission lines instead of, or in combination with, the transmission line stubs.

Note that throughout this document, the terms "parallel" and "shunt" will be used synonymously with regard to the connection of circuit elements or transmission line stubs.

DESCRIPTION OF THE DRAWINGS

The invention is described in greater detail by way of example only and with reference to the attached drawings, in which.

DETAILED DESCRIPTION

Figure 1:
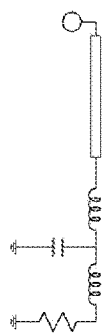
FIG. 1. Even-mode equivalent circuit of a prototype reflectionless filter using lumped elements with an arbitrary length of matched cascaded transmission line at the input. The order of the filter at this stage is arbitrary.

As embodied and broadly described herein, the disclosures herein provide detailed embodiments of the invention. However, the disclosed embodiments are merely exemplary of the invention that can be embodied in various and alternative forms. Therefore, there is no intent that specific structural and functional details should be limiting, but rather the intention is that they provide a basis for the claims and as a representative basis for teaching one skilled in the art to variously employ the present invention.

A problem in the art capable of being solved by the embodiments of the present invention is a circuit topology and design technique for electronic filters that are well-matched at all frequencies. It has been surprisingly discovered that such filters have a number of unexpected advantages, including minimal reflections on their input and output ports, either in their pass bands or stop bands, or the transition bands. The return loss for these filters is substantially infinite at all frequencies. In conventional filters, on the other hand, stop band rejection is achieved by reflecting the unwanted portion of the spectrum back toward the signal source rather than absorbing it. The instant filters are comprised of transmission lines along with lumped element resistors, inductors, and capacitors, or of transmission line equivalents, and can be implemented in whatever form is suited to the application (e.g. waveguide, coaxial, wire-leaded, surface-mount, monolithically-integrated).

Initially, one starts with an arbitrary, symmetric, two-port network. While symmetry is not required of reflectionless filters, the preferred embodiment is symmetrical. In such a network, if both ports are excited simultaneously with equal signal amplitudes and matching phase, there will be no currents crossing from one side of the symmetry plane to the other. This is called the even-mode. Similarly, if the two ports are excited with equal amplitudes but 180° out of phase, then all nodes that lie on the symmetry plane should have zero electric potential with respect to ground. This is called the odd-mode.

Therefore, it is possible to have two single-port networks, each containing one half of the elements of the original two-port network, where the nodes that lie on the symmetry plane are either open-circuited or shorted to ground. These can be called the even-mode equivalent circuit and the odd-mode equivalent circuit, respectively. Equivalent circuits are circuits that retain all of the electrical characteristics of the original (and often more complex) circuits. The scattering parameters of the original two-port network are then given as the superposition of the reflection coefficients of the even- and odd-mode equivalent circuits, as follows:

$$s_{11}=s_{22}=\tfrac{1}{2}(\Gamma_{even}+\Gamma_{odd}) \quad (1)$$

$$s_{21}=s_{12}=\tfrac{1}{2}(\Gamma_{even}-\Gamma_{odd}) \quad (2)$$

wherein $s_{ij}$ is the scattering coefficient from port j to port i, and $\Gamma_{even}$ and $\Gamma_{odd}$ are the reflection coefficients of the even- and odd-mode equivalent circuits, respectively. Thus, the condition for perfect input match, $s_{11}=0$, is derived from (1) as follows:

$$\Gamma_{even}=-\Gamma_{odd} \quad (3)$$

This is equivalent to saying that the normalized even-mode input impedance is equal to the normalized odd-mode input admittance (or vice-versa):

$$z_{even}=y_{odd} \quad (4)$$

wherein $z_{even}$ is the normalized even-mode impedance, and $y_{odd}$ is the normalized odd-mode admittance, which is satisfied if the even- and odd-mode circuits are duals of each other (e.g. inductors are replaced with capacitors, shunt connections with series connections). Further, by combining (2) and (3), the transfer function of the original two-port network is given directly by the even-mode reflection coefficient:

$$s_{21}=\Gamma_{even} \quad (5)$$

It is therefore often useful to construct the even-mode equivalent circuit as the dual of the odd-mode equivalent circuit, and vice-versa. When the filter comprises transmission lines, the dual may be constructed by replacing cascaded transmission lines with others having the inverse normalized characteristic impedance, and by replacing open-circuited stubs with short-circuited stubs, and parallel-connections with series-connections. In some embodiments, it may be necessary to apply transmission line identities to restore symmetry after constructing the even- and odd-mode equivalent circuits, or to make the topology more easily manufacturable. In a preferred embodiment, the Kuroda Identities are especially useful to transform series-connected stubs into parallel-connected stubs, or vice-versa. Note that to make this particular identity transformation possible, it is often useful to insert one or more matched cascade transmission lines at the input and/or at a lossy termination of the even- or odd-mode equivalent circuits.

In some preferred embodiments, it is useful to apply a transmission line identity that replaces a cascade transmission line having a transmission line stub at one end with a coupled-transmission line. In other embodiments, a series-connected stub may exchange positions with a lossy termination connected in series with it, resulting in a series lossy element followed by a parallel-connected stub.

Note that reflectionless filters comprising transmission lines may be enhanced with matched-internal sub-networks.

These sub-networks may themselves comprise transmission lines, lumped-elements, or both.

Figure 2:
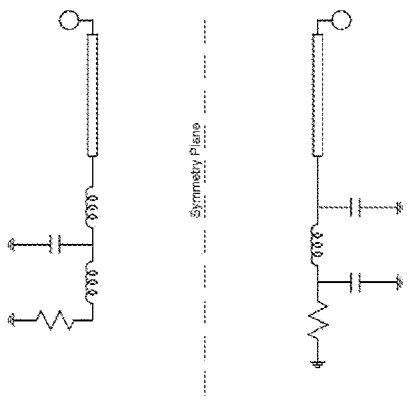
FIG. 2. Even-mode (left) and odd-mode (right) equivalent circuits of a reflectionless filter in the early stages of derivation.
Figure 3:
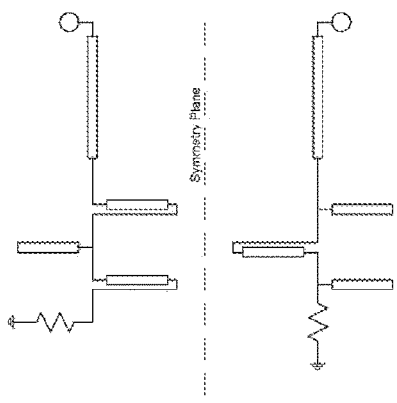
FIG. 3. Even- and odd-mode equivalent circuits incorporating series short-circuited stubs and shunt open-circuited stubs after application of Richard's Transformations.

In a preferred embodiment, a reflectionless band-pass electronic filter comprising transmission lines is preferably designed as follows: First, the even-mode equivalent circuit is drawn as a terminated high-pass filter comprising a ladder network of series inductors and shunt capacitors. It was previously shown that the transfer characteristic of the symmetric two-port network will be equal to the reflection characteristic of the even-mode equivalent circuit. Further, upon substitution of transmission lines in place of the lumped elements in the even-mode equivalent circuit, the high-pass response will be converted to a band-stop response as a consequence of the periodicity of the transmission line scattering parameters. To facilitate later application of identity transformations, it is useful at this stage to insert a length of matched transmission line in cascade at the beginning of the even-mode equivalent circuit (thus affecting the reflection phase of the circuit but not the amplitude response). The resultant even-mode equivalent circuit is thus in FIG. 1. A third-order filter is shown in this example, but at this stage the order of the filter is arbitrary. The odd-mode equivalent circuit is preferably constructed as the dual of the even-mode equivalent circuit—that is, by replacing series elements with shunt elements, shunt elements with series elements, inductors with capacitors, and capacitors with inductors. The resistor terminations and matched input transmission line sections remain unchanged. The resulting even- and odd-mode equivalent circuits are shown in FIG. 2. Next, the well-known Richard's Transformations are preferably applied to convert the reactive elements to transmission line stubs. The result is shown in FIG. 3. Modifications are preferably made to both the even- and odd-mode equivalent circuits to restore the assumed symmetry of the filter without altering the port behavior, only now these modifications are being made to networks with transmission lines instead of only lumped elements.

Figure 4:
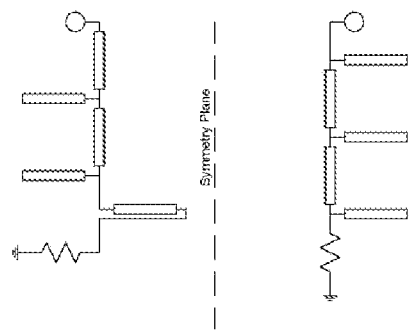
FIG. 4. Even- and odd-mode equivalent circuits after application of Kuroda's Identities.

In a preferred embodiment, Kuroda's Identities are used to transform the series short-circuited stubs on both sides to shunt open-circuited stubs spaced a quarter-wavelength apart, as shown in FIG. 4. One series short-circuited stub is left un-altered at the end of the even-mode equivalent circuit.

Figure 5:
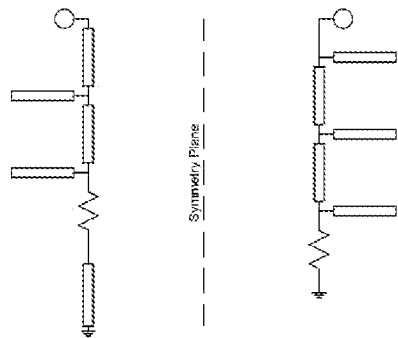
FIG. 5. Even- and odd-mode equivalent circuits after swapping positions of the series stub and termination resistor in the even-mode equivalent circuit.
Figure 6:
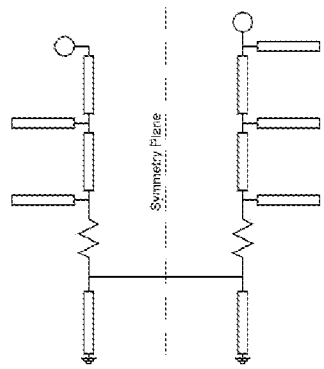
FIG. 6. Even- and odd-mode equivalent circuits after restoration of symmetry conditions near the termination resistors.

Next, in the preferred embodiment, the positions of the remaining short-circuited stub and the termination resistor in the even-mode equivalent circuit, which are in series, are exchanged. This leaves the short-circuited stub now in a shunt position, as shown in FIG. 5. A connecting line is preferably drawn from the node between this shunt short-circuited stub and the termination resistor in the even-mode equivalent circuit to the symmetry plane. In the odd-mode equivalent circuit, the ground node of the termination resistor is preferably replaced with a virtual short on the symmetry plane, and a shunt short-circuited stub is preferably attached to this virtual ground node. This completes restoration of the symmetry near the termination resistors, as shown in FIG. 6.

Figure 7:
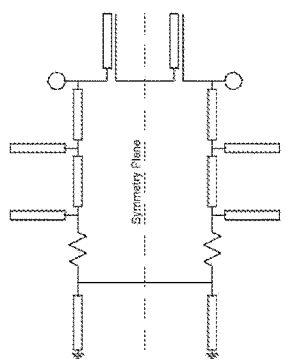
FIG. 7. A full two-port band-pass reflectionless filter using transmission lines.

To restore symmetry near the port nodes in a preferred embodiment, the shunt open-circuited stub at the input of the odd-mode equivalent circuit is connected in series between the input node and the virtual ground of the symmetry plane. Similarly, a series open-circuited stub is preferably added between the input node of the even-mode equivalent circuit and the symmetry plane. At this point, a full two-port reflectionless filter is obtained that satisfies all symmetry and duality conditions, as shown in FIG. 7. However, the series open-circuited stubs are not realizable in some transmission line media. In a preferred embodiment, the transmission line identity shown in FIG. 8 may be applied to remove these series open-circuited stubs. The resultant network uses coupled transmission lines, and is shown in FIG. 9.

Figure 10:
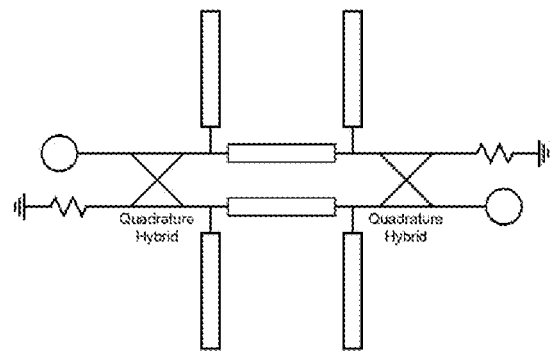
FIG. 10. A conventional directional filter for comparison with the reflectionless filter in FIG. 9.

It is instructive at this stage to contrast this topology with that of a more conventional and well-known type of absorptive filter, shown in FIG. 10. Called a directional filter, the input and output quadrature hybrids direct reflections from the two sub-filters into the termination resistors at either end. The quadrature hybrids are often approximated using coupled transmission lines. This is not a reflectionless filter, however, as it only provides good impedance match over a limited range of frequencies where the amplitude and phase balance between the thru-port and coupled port are close to 0 dB and 90 degrees, respectively. The embodiment of the reflectionless filter in FIG. 11, on the other hand, uses a similar set of components but is well-matched at all frequencies, including those where the amplitude and phase imbalance of the coupled line sections is arbitrarily large.

Figure 11:
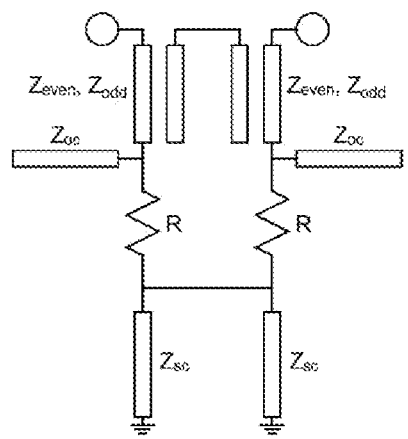
FIG. 11. One embodiment of the transmission line reflectionless filter using only a single pair of open-circuited stubs.

The order of the filter chosen in the initial even-mode equivalent circuit determines the number of open-circuited stubs in the final transmission line network. This number is arbitrary. In one embodiment, only a single pair of open-circuited stubs is required, as shown in FIG. 11. The characteristic impedances of the transmission lines and stubs are constrained by the requirements of duality and symmetry. They may be parameterized in terms of the free parameter, $x>1$, as follows:

$$\rho = 2x^2 - 1 + 2x\sqrt{x^2 - 1} \tag{6a}$$

$$Z_{even} = Z_0\sqrt{\rho} \tag{6b}$$

$$Z_{odd} = Z_0/\sqrt{\rho} \tag{6c}$$

$$Z_{oc} = \frac{Z_0}{x - x^{-1}} \tag{6d}$$

$$Z_{sc} = Z_0(x - x^{-1}) \tag{6e}$$

$$R = Z_0. \tag{6f}$$

Figure 12:
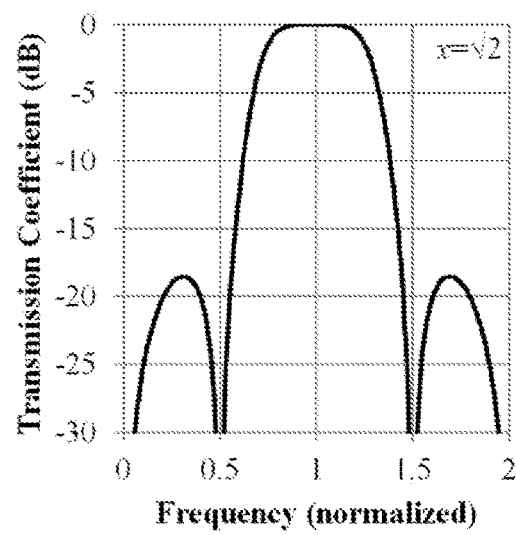
FIG. 12. A plot of the transfer characteristic of the reflectionless filter in FIG. 11.

The band-pass transfer characteristic of this circuit is shown in FIG. 12. The reflection response of this circuit is identically zero at all frequencies.

Figure 8:
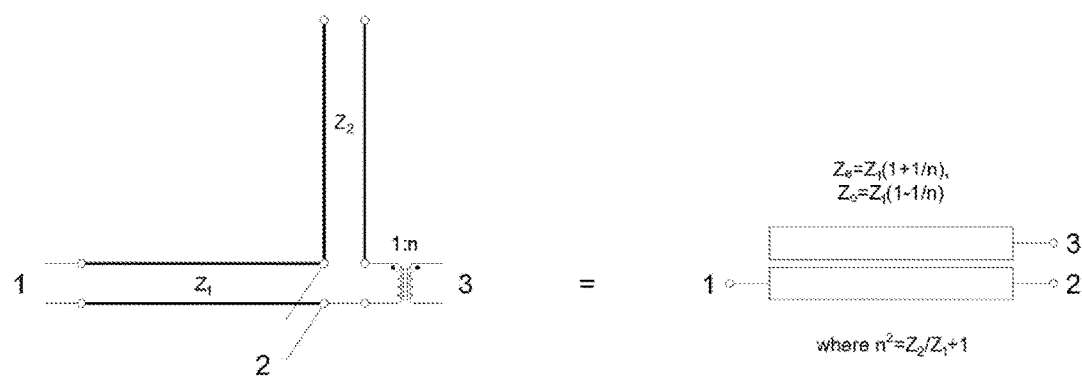
FIG. 8. A transmission line identity that is useful for replacing series-connected open-circuited stubs in the transmission line reflectionless filters with coupled transmission lines.
Figure 9:
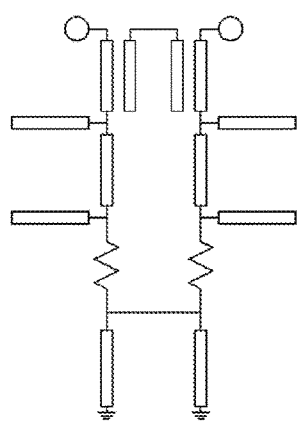
FIG. 9. The reflectionless filter of FIG. 7 after two applications of the identity in FIG. 8.
Figure 13:
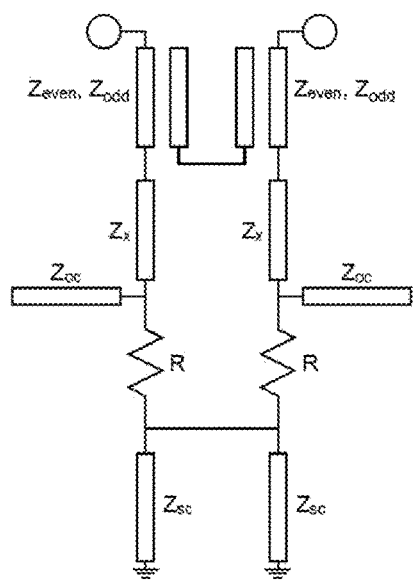
FIG. 13. Alternate form of the reflectionless filter in FIG. 11. The transfer characteristics of the two forms are identical (shown in FIG. 12) but with different coupled-line impedance parameters that may be easier to fabricate in some cases.

An alternate form of the reflectionless filter may be obtained by first adding another matched transmission line segment at the input ports (equivalent to a shift in the port reference planes) prior to application of the transmission line identity in FIG. 8. Then the identity is applied on these new transmission lines with the series stubs, essentially reversing the orientation of the coupled lines in the resultant circuit, which is shown in FIG. 13. This also leaves an additional cascade section, denoted "$Z_x$" in the Figure. The characteristic impedances are once again constrained by the requirements of duality and symmetry, as follows:

$$\rho = 1 + 2(x - x^{-1}) + 2\sqrt{(x - x^{-1})(1 + x - x^{-1})} \tag{7a}$$

$$Z_{even} = Z_0 \frac{2\rho}{\rho + 1} \tag{7b}$$

$$Z_{odd} = Z_0 \frac{2}{\rho + 1} \tag{7c}$$

-continued $$Z_x = Z_0 x \tag{7d}$$

$$Z_{oc} = \frac{Z_0}{x - x^{-1}} \tag{7e}$$

$$Z_{sc} = Z_0(x - x^{-1}) \tag{7f}$$

$$R = Z_0. \tag{7g}$$

The resulting filter has exactly the same impedance and transfer characteristics as that in FIG. 11, but with different coupled line parameters that may be easier to fabricate in some circumstances. As before, the order of the filter and the consequent number of transmission line stubs is arbitrary.

In the previous embodiments, the filter resonators were formed by transmission-line stubs. In other embodiments, one or more of the transmission line stubs may be replaced by additional cascaded transmission lines. In a preferred embodiment, these additional cascaded transmission lines have characteristic impedance given by $$Z_r = Z_0 x^{-1} \tag{8}$$

Figure 14:
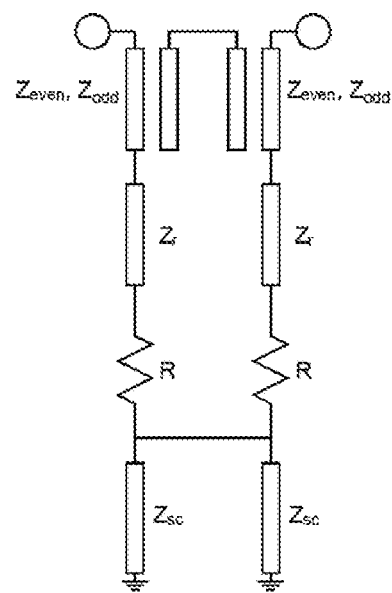
FIG. 14. Another embodiment of the transmission line reflectionless filter using a cascaded line resonator instead of stubs.
Figure 15:
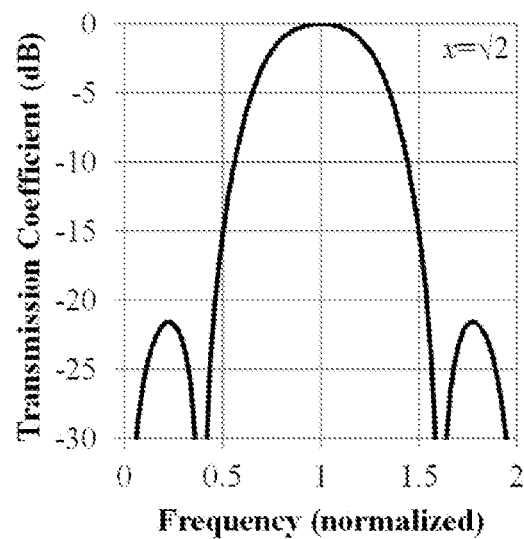
FIG. 15. A plot of the transfer characteristic of the reflectionless filter in FIG. 14.

An example is shown in FIG. 14, obtained by replacing the stub resonators, $Z_{oc}$, in FIG. 11 with a line resonator, $Z_r$. Its simulated performance is shown in FIG. 15. In general the cascaded line resonators will result in lower side lobes, at the cost of more rounded passband corners.

Other embodiments and uses of the invention will be apparent to those skilled in the art from consideration of the specification and practice of the invention disclosed herein. All references cited herein, including all publications, U.S. and foreign patents and patent applications, are specifically and entirely incorporated by reference. It is intended that the specification and examples be considered exemplary only with the true scope and spirit of the invention indicated by the following claims. Furthermore, the term "comprising of" includes the terms "consisting of" and "consisting essentially of."

The invention claimed is:

1. A reflectionless, impedance-matched, electronic filter comprising:
a symmetric two-port network, wherein the symmetry defines an even-mode equivalent circuit and an odd-mode equivalent circuit when the ports are driven in-phase and 180-degrees out-of-phase, respectively, such that:
a normalized input impedance of the even-mode equivalent circuit is substantially equal to the normalized input admittance of the odd-mode equivalent circuit; and
a normalized input admittance of the even-mode equivalent circuit is substantially equal to the normalized input impedance of the odd-mode equivalent circuit;
wherein the two ports are known as the input and output, respectively,
wherein the ports are connected through a pair of coupled-line sections, one on the input-port side, the other on the output-port side,
wherein the coupled transmission-line sections connected to the ports are also connected to identical chains of cascaded transmission-line sections, transmission-line stubs, and additional coupled transmission lines, with one chain on the input side and one chain on the output side;
wherein the chains on each side are terminated by resistors or one or more impedance-matched internal subnetworks;
wherein the resistors or matched internal subnetworks may be grounded through transmission-line stubs.

2. The reflectionless filter of claim 1, wherein the chains on the input side and the output side may be connected at one or more points by coupled transmission lines.

3. The reflectionless filter of claim 1, wherein the transmission lines, stubs, and coupled lines are all essentially a quarter wavelength long at the center frequency of operation.

4. The reflectionless filter of claim 1, wherein the identical chains on the input side and the output side each comprise an alternating pattern of cascade transmission lines and open-circuited stubs.

5. The reflectionless filter of claim 4, wherein the normalized characteristic impedance of the cascade lines in each of the identical chains on the input side and output side is labeled x;
and wherein the normalized characteristic impedance of the open-circuited stubs in the identical chains is $(x-x^{-1})^{-1}$;
and wherein the resistors or matched internal subnetworks are grounded through transmission-line stubs having normalized characteristic impedance $(x-x^{-1})$.

6. The reflectionless filter of claim 5, wherein the coupled lines connected to the input port and the output port have coupling factor $\rho=1+2(x-x^{-1})+2[(x-x^{-1})(1+x-x^{-1})]^{1/2}$; and wherein the normalized even-mode characteristic impedance of the coupled lines is $2\rho/(\rho+1)$ and the normalized odd-mode characteristic impedance of the couple lines is $2/(\rho+1)$.

7. The reflectionless filter of claim 5, wherein the coupled lines connected to the input port and the output port have coupling factor $\rho=2x^2-1+2x(x^2-1)^{1/2}$; and wherein the normalized even-mode characteristic impedance of the coupled lines is $\rho^{1/2}$ and the normalized odd-mode characteristic impedance of the couple lines is $\rho^{-1/2}$.

8. The reflectionless filter of claim 1, wherein the identical chains on the input side and the output side each comprise a pattern of cascade transmission lines of alternating high- and low-impedance, relative to one another.

9. The reflectionless filter of claim 8, wherein the cascade transmission lines in each chain with relatively high impedance have normalized characteristic impedance labeled x,
and the cascade transmission lines in each chain with relatively low impedance of normalized characteristic impedance $x^{-1}$;
and wherein the resistors or matched internal subnetworks are grounded through transmission-line stubs having normalized characteristic impedance $(x-x^{-1})$.

10. The reflectionless filter of claim 9, wherein the coupled lines connected to the input port and the output port have coupling factor $\rho=1+2(x-x^{-1})+2[(x-x^{-1})(1+x-x^{-1})]^{1/2}$; and wherein the normalized even-mode characteristic impedance of the coupled lines is $2\rho/(\rho+1)$ and the normalized odd-mode characteristic impedance of the couple lines is $2/(\rho+1)$.

11. The reflectionless filter of claim 9, wherein the coupled lines connected to the input port and the output port have coupling factor $\rho=2x^2-1+2x(x^2-1)^{1/2}$; and wherein the normalized even-mode characteristic impedance of the coupled lines is $\rho^{1/2}$ and the normalized odd-mode characteristic impedance of the couple lines is $\rho^{1/2}$.

12. The reflectionless filter of claim 1, wherein the resistors or matched internal subnetworks are grounded through matched transmission-line stubs which are short-circuited.

13. The reflectionless filter of claim 1, wherein the even- and odd-mode equivalent circuits exhibit a low-pass response, and the completed two-port filter exhibits a high-pass or band-pass response.

14. The reflectionless filter of claim 1, wherein the identical chains on the input side and the output side are terminated by an impedance-matched internal subnetwork which connects to the two chains.

15. The reflectionless filter of claim 14, wherein the impedance-matched internal subnetwork comprises one or more of transmission lines, lumped elements, and active circuits.

* * * * *